United States Patent [19]

Iijima

[11] Patent Number: 4,891,791
[45] Date of Patent: Jan. 2, 1990

[54] DATA WRITING SYSTEM FOR EEPROM

[75] Inventor: Yasno Iijima, Yokohama, Japan

[73] Assignee: Kabushiki Kaisha Toshiba, Kawasaki, Japan

[21] Appl. No.: 182,021

[22] Filed: Apr. 15, 1988

[30] Foreign Application Priority Data

Apr. 30, 1987 [JP] Japan .................................. 62-104506

[51] Int. Cl.⁴ .............................................. G11C 7/00
[52] U.S. Cl. ........................... 365/189.01; 365/189.05
[58] Field of Search ........... 365/189, 230, 233, 189.01, 365/238.5, 189.05

[56] References Cited

U.S. PATENT DOCUMENTS 4,707,809 11/1987 Ando .................................... 365/189

Primary Examiner—Joseph A. Popek
Attorney, Agent, or Firm—Cushman, Darby & Cushman

[57] ABSTRACT

A memory cell array of an EEPROM is divided into bit columns including 8192 words, each column being a unit for 8-bit access. An input data latch of 8 bits×32 words receives 8-bit data when data is written in the memory cell array. When the data is written in the memory cell array, a write controller permits the input data latch to receive the 8-bit data, then refers to an access ID latch to discriminate only the data received within a predetermined time by the input data latch, and writes only the received data into a predetermined divided region of the memory cell array.

17 Claims, 3 Drawing Sheets

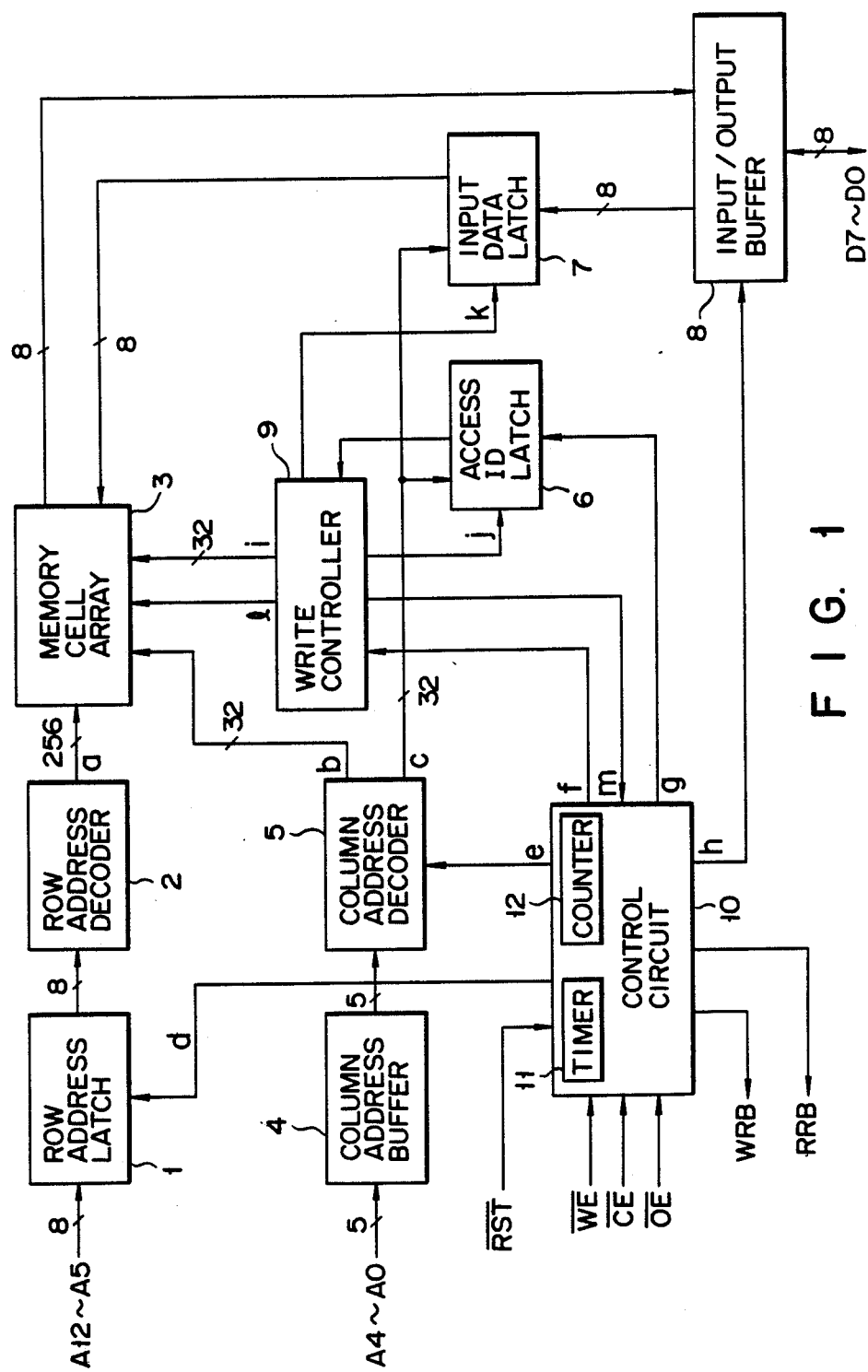
F I G. 1

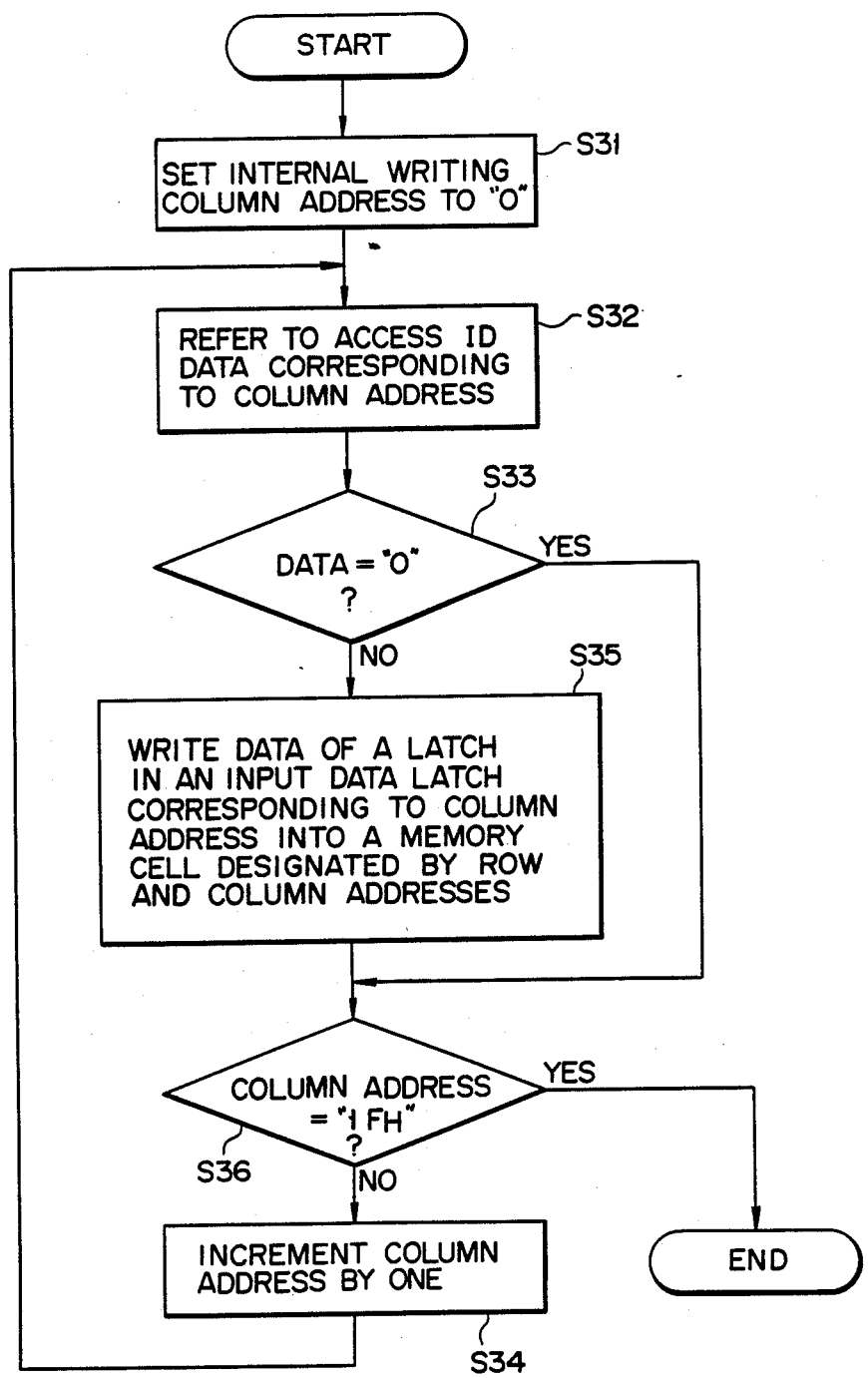
F I G. 3

DATA WRITING SYSTEM FOR EEPROM

BACKGROUND OF THE INVENTION

1. Field of the Invention

The present invention relates to a data writing system for a semiconductor memory used as a data memory in, for example, an IC card, and, in particular, to an auto page writing system for an EEPROM.

2. Description of the Related Art

EEPROMs, which permit electrical data erasing and rewriting, have recently become the object of considerable attention as a semiconductor memory for replacing EPROMs. Due to the EEPROMs requiring longer data writing time than EPROMs, however, various improvements have been made to the EEPROMs.

Of the improved EEPROMs, what is receiving attention is the type which has a buffer constituted by, for example, a RAM of several bytes such that data writing is done in the buffer within a specified time period and the contents of the buffer are then internally written in the EEPROM. The data writing time in this memory is about the same as what is required of an EPROM, so that the data writing time appears to be shortened. This EEPROM utilizes a system in which the memory is divided on the basis of the paging concept and some lower significant bits of an address data sent to the memory indicate the number of bytes in a page and the remaining higher significant bits indicate the number of pages. From that concept, this system is called a so-called page writing function.

A conventional page writing system functions as follows. Data for the page to be written is transferred into advance in the buffer from the memory, and data externally input replaces the data in the buffer. After a specified time, all the contents of the buffer are stored again in the specified page of the memory.

According to this system, for example, with an EEPROM of 8192 words × 8 bits, if each page has a 16 byte area, then address "$0000_H$" and address "$000F_H$" exist in the same page. If only the data at address "$0000_H$" is rewritten, data from address "$0000_H$" to address "$000F_H$" is temporarily stored in the buffer where the data corresponding to address "$0000_H$" alone is rewritten. Then, all the data in the buffer is written in the memory area from address "$0000_H$" to address "$000F_H$". That is, even if the data at address "$0000_H$" alone is rewritten, data writing is actually done to address "$000F_H$". Provided that the maximum rewritable number for an EEPROM is 10000, when data rewriting is done only to "$0000_H$" 10000 times, there would not be any guarantee for proper data writing for "$000F_H$". In other words, the writing times for the memory cells is excessive in this case, thus reducing the life of the memory cells.

Conventionally, the write data reception time is fixed so that, when data input time is half the write data reception time in order to rewrite all the contents of a given page, the conventional EEPROM does not start the internal data writing unless the remaining half of the write data reception time is elapsed. From a global point of view, this results in a time loss in executing page writing, thus making it impossible to provide a higher data writing.

Further, according to the prior art, in order to cancel the page writing operation after data access is done within a given time for page writing, it is necessary to power off the EEPROM, for example, by shutting off the power supplied thereto.

In addition, the time specified for data writing in the buffer is only described in the specification. Therefore, the page writing operation for an EEPROM serving as an external unit is designed on the basis of the value given in the specification. Depending on EEPROMs, however, when the specified writing time becomes short due to some factors such as data writing environment, the external unit may erroneously recognize as if all the accessed data has been written. In this respect, therefore, there is a demand for a system which permits such an external unit to easily recognize whether or not an EEPROM is in the data reception state.

SUMMARY OF THE INVENTION

It is therefore an object of this invention to provide a data writing system which reduces the writing times of memory cells so as to prevent reduction in the life of the memory cells.

Another object of the present invention is to provide a data writing system which can reduce a total write-in loss a the time of page writing operation and implement a high-speed writing process.

It is another object of this invention to provide a data writing system which can cancel a page writing operation upon reception of an external request, without shutting off power, etc.

It is a still another object of this invention to provide a data writing system which ensures easy external recognition of the data reception time at the time the page writing is carried out.

A data writing system according to this invention therefore comprises:

memory means for storing data having at least one bit per word to be stored therein;

data storage means for receiving data of $2^n$ words at a time of data writing in the memory means, where n is a positive integer; and writing means for writing the data stored in the data storage means into the memory means, after the data of $2^n$ words or smaller is received by the data storage means, the writing means writing only the data received in the data storage means within a predetermined time into the memory means.

BRIEF DESCRIPTION OF THE DRAWINGS

FIG. 1 is a circuit block diagram of an EEPROM;

FIG. 3 is a flowchart for explaining an internal writing process.

DETAILED DESCRIPTION OF THE PREFERRED EMBODIMENT

Figure 2:
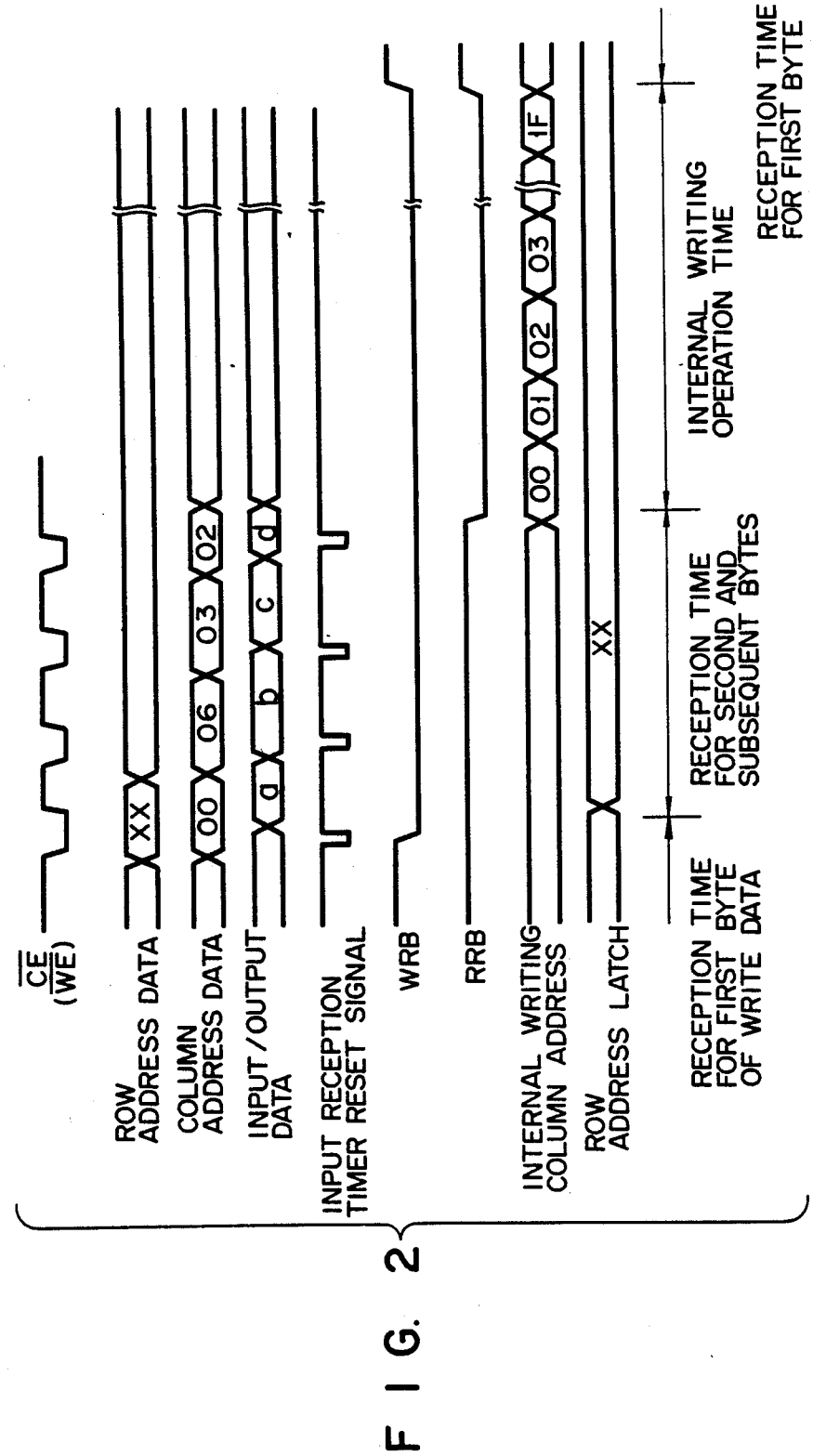
FIG. 2 is a timing chart illustrating the timing for data writing.

An embodiment of this invention will now be explained with reference to the accompanying drawings.

FIG. 1 illustrates the circuit structure of an EEPROM of, for example, 64 kilobits (8192 words × 8 bits). A row address latch 1 latches the upper 8 bit data $A_{12}$-$A_5$ of address data $A_{12}$-$A_0$ in response to a signal d from a control circuit 10, which will be described later A row address decoder 2 decodes the address data $A_{12}$-$A_5$ latched by row address latch 1 to produce a row select signal a and sends the signal a to a memory cell array 3 of 8192 words × 8 bits. A column address buffer 4 stores the lower 5 bit data $A_4$-$A_0$ of address data $A_{12}$-$A_0$. A column address decoder 5 decodes the address data $A_4$–$A_0$ from column address buffer 4 in response to a signal e (to be described later) from control circuit 10 to produce column select signals b and c.

An access identification (ID) latch 6 latches access ID data in response to signal c from column address decoder 5. An input data latch 7 latches 8 bit data from an input/output buffer 8, which will be described later, in response to signal c from column address decoder 5. The input/output buffer 8 stores 8-bit input/output data $D_7$–$D_0$ in response to a signal h from control circuit 10, which will be described later. A write controller 9 executes an internal writing operation in response to a signal f from control circuit 10, which will be described later.

Control circuit 10 controls the data writing and reading done to the present EEPROM. This control circuit 10 externally receives an $\overline{RST}$ signal (signal for cancelling the internal writing operation), a $\overline{WE}$ signal (write enable signal), and an $\overline{OE}$ signal (output enable signal), and outputs a WRB signal and an RRB signal as write status signals to the outside, the latter two signals being described later.

FIG. 2 illustrates the external writing timing for the EEPROM disclosed in FIG. 1. In the normal state, both of the WRB and RRB signals are at an "H" level. The WRB signal becomes "L" level when the first byte of write bytes is accessed and again becomes "H" level when the subsequent internal writing operation is completed.

Control circuit 10 includes a timer 11 and a counter 12. Timer 11 is for determining a data reception time for the next write bytes after the present write bytes have been input. Counter 12 counts how many times the write bytes are received. According to this embodiment, the data reception ends upon reception of, for example, 32 bytes. Timer 11 is designed to overflow upon elapse of 50 μs after being reset. In other words, the reception operation for the write bytes will end either when 50 μs has elapsed between accessing of one byte and the next byte or when accessing between bytes falls within 50 μs but 32 bytes are accessed. The count-up operation of counter 12 and the reset operation for timer 11 are executed by an input reception timer reset signal (pulse) that is produced by a data writing operation. It is the RRB signal which informs to the outside whether or not the data reception operation is in process, and this signal becomes "L" level upon completion of the data reception and becomes "H" level upon completion of the subsequent internal writing operation.

When both the WRB and RRB signals are "H" level, it means that the EEPROM is ready for the first byte of write bytes. When the WRB signal is "L" level and the RRB signal is "H" level, the first byte has already been received and the reception of the subsequent bytes is being carried out. When both of the WRB and RRB signals are "L" level, the write byte reception is inhibited and the internal writing operation is in process. This permits an external unit to easily discriminate the above three states.

When data writing is performed with both of the WRB and RRB signals being at "H" level, address data $A_{12}$–$A_5$ is latched as a row address in row address latch 1 by the signal (signal d in FIG. 1) resulting from a logical product of the $\overline{CE}$ and $\overline{WE}$ signals. At this time, the WRB signal is set to "L" level. At the same time, column address decoder 5 decodes address data $A_4$–$A_0$ from column address buffer 4 based on the signal (signal e in FIG. 1) which is a logical product of the $\overline{CE}$ and $\overline{WE}$ signals, thereby producing the signal c.

Access ID latch 6 is constituted by 32 1-bit latches and is normally reset; only that constituent latch which is selected by the signal c is set. Input data latch 7 is constituted by latches of 8 bits × 32 words; each 8-bit latch is selected by the signal c and the latch selected at this time latches data coming through input/output buffer 8. In other words, when data values of $A_4$–$A_0$ are input at random, they are stored in their associated 8-bit latches and access ID latch 6 stores data that indicates in which latches the data is stored.

In the case of FIG. 2, upon elapse of the data reception time, data "xx" is latched in row address latch 1. In input data latch 7, data "a" is latched in the first 8-bit latch, and data "d", "c", and "b" are latched in the third, fourth and seventh 8-bit latches, respectively. In access ID latch 6, the first-bit, third-bit, fourth-bit and seventh-bit latches are set with the remaining ones being reset.

The internal writing operation will now be explained, referring to the flowchart of FIG. 3. First, upon elapse of the data reception time, the column address for the internal writing operation is set to "0" (step S31). This column address is generated by a column address generator (not shown) included in write controller 9 and is a value between "00" to "1F". The output of the column address generator is decoded to thereby produce the row select signal i and the signals j and k.

Based on the generated signal j, write controller 9 selects the associated latch in access ID latch 6, i.e., controller 9 refers to the access ID data corresponding to the column address (step S32) and discriminates whether or not the selected latch is set (step S33). If the latch is not set (or at "0"), no data writing to memory cell array 3 is performed and the address is incremented by one by the column address generator (step S34).

If the selected latch is in the set state (or at "0"), based on the generated signal k, write controller 9 selects the associated 8-bit latch in input data latch 7 or selects the 8-bit latch of input data latch 7 which corresponds to the column address. The data in the selected latch is sent to memory cell array 3, and at the same time, the memory cell to be accessed for data writing is designated by the column select signal i (column address) and row select signal a (row address) and a write permit signal 1 is supplied to memory cell array 3. Upon reception of the write permit signal 1, memory cell array 3 stores data received in advance into the memory cell (of 8 bits) designated by the address data (step S35). Write controller 9 discriminates that the data has been written in memory cell array 3 and causes its column address generator to increment the column address by one (step S34).

Prior to step S34 where the column address is incremented by one, however, it is determined whether or not the address is "$1F_H$" (step S36). If the decision is affirmative, write controller 9 sends a signal m to control circuit 10 to inform that the writing operation is completed. When acknowledging the end of the writing operation through the signal m, control circuit 10 sets both the WRB and RRB signals at "H" level and resets all the latches of access ID latch 6 using a signal g, setting latch 6 back to the normal memory state.

During the internal writing operation in FIG. 2, the $\overline{CE}$, $\overline{WE}$, and E,ovs/OE/ signals are ineffective.

A read operation is performed in response to the $\overline{CE}$ and $\overline{OE}$ signals that are input during a read permit time (the period other than the internal writing period in FIG. 2). If control circuit 10 discriminates at this time that the read operation is being performed, address data $A_{12}$-$A_5$ is converted into the row select signal a by row address decoder 2 through row address latch 1. Address data $A_4$-$A_0$ is converted into the column select signal b by column address decoder 5 through column address buffer 4. Data in the memory cell (of 8 bits) specified by the row select signal a and column select signal b is read out and stored in input/output buffer 8 by signal h.

When the $\overline{RST}$ signal is set to "L" level during the data reception period in FIG. 2, control circuit 10 sets both of the WRB and RRB signals to "H" level, and, at the same time, resets all the latches of access ID latch 6, thus setting the latch 6 back to the normal memory state.

According to the present data writing system, there is provided means (access ID latch 6) for storing access ID data for the buffers for one page so that those buffers accessed within a specified time can be discriminated and only the contents of the buffers accessed during the internal writing operation are written in the memory cells. This can ensure that only the data received during the data reception time is accurately written in the target memory cells. Therefore, the writing times of the memory cells can be reduced, thus preventing the life of the memory cells from being shortened.

In addition, counter 12 for counting the quantity of data received at the time of the data reception is provided so that when the quantity of the counted data reaches a predetermined value (for example, 32 bytes), the write data reception is ended and the internal writing operation is performed immediately thereafter. This reduces an overall write time loss at the time of the page writing operation, thus ensuring a higher writing operation.

Further, control circuit 10 is designed to receive the internal writing cancel signal ($\overline{RST}$ signal), which is externally generated, so that upon reception of this signal during the write data reception time, the present system resets the internal circuits to cancel the page writing operation and returns to the normal state. With this design, therefore, even when the memory cells are accessed for a page writing operation at some timing, the page writing operation can be canceled by an external request.

Furthermore, at the time of the page writing operation, the write status signals (WRB and RRB signals) are output to the outside and the levels of these write status signals are changed at the time when the first byte is received for the page writing operation, at the time when a predetermined time has elapsed (the data reception operation is ended) and at the time when the internal writing operation is ended. This ensures an easy external detection of the data reception time for the page writing operation, thus providing an effective writing sequence as an external unit.

What is claimed is:

1. A data writing system comprising:
   memory means for storing data having at least one bit per word to be stored therein, the memory means having $2^m$ divided regions, where m is a positive integer, said memory means recognizing that divided region which is to be accessed by m bits of address data including m+n bits, and said memory means recognizing $2^n$ words in said recognized divided region, where n is a positive integer;
   data storage means for receiving data of said $2^n$ words at a time of data writing in said memory means, said data storage means being recognized by said memory means; and
   writing means for writing said data stored in said data storage means into said memory means, after said data of $2^n$ words or smaller is received by said data storage means, said writing means writing said data received in said data storage means within a predetermined time into said memory means.

2. The data writing system according to claim 1, wherein said writing means includes recognition means for recognizing that data among data stored in said data storage means which has been received within said predetermined time and writes only said data of said data storage means recognized by said recognition means into an associated word of said memory means.

3. The data writing system according to claim 1, further comprising:
   data quantity discrimination means for discriminating a quantity of data received by said data storage means; and
   control means for causing said data storage means to stop data reception when said quantity of data discriminated by said data quantity discrimination means reaches a predetermined value.

4. The data writing system according to claim 3, wherein said control means includes timer means and causes said data storage means to stop data reception when time measured by said timer means reaches said predetermined time.

5. The data writing system according to claim 3, wherein said predetermined value is $2^n$.

6. The data writing system according to claim 3, wherein said control means causes said writing means to stop a writing operation by means of an externally supplied signal.

7. The data writing system according to claim 6, wherein said control means outputs to an outside a signal indicating a data reception period for said data storage means.

8. The data writing system according to claim 1, further comprising control means for causing said writing means to stop a writing operation by means of an externally supplied signal.

9. The data writing system according to claim 7, wherein said control means outputs to an outside a signal indicating a data reception period for said data storage means.

10. The data writing system according to claim 1, further comprising control means for outputting to an outside a signal indicating a data reception period for said data storage means.

11. The data writing system according to claim 1, wherein said memory means is included in an EEPROM.

12. A data writing system comprising:
   memory means for storing data having at least one bit per word to be stored therein;
   data storage means for receiving data of $2^n$ words at a time of data writing in said memory means, wherein is a positive integer;
   data quantity discrimination means for discriminating a quantity of data received by said data storage means;
   writing means for writing said data stored in said data storage means into said memory means when said quantity of data discriminated by said data quantity discrimination means reaches to $2^n$; and control means for causing said data storage means to stop data reception when said quantity of data discrimination means reaches $2^n$.

13. The data writing system according to claim 12, wherein said control means includes timer means and causes said data storage means to stop data reception when time measured by said timer means reaches a predetermined time.

14. The data writing system according to claim 12, wherein said control means causes said writing means to stop a writing operation by means of an externally supplied signal.

15. The data writing system according to claim 12, wherein said control means outputs to an outside a signal indicating a data reception period for said data storage means.

16. The data writing system according to claim 12, wherein said memory means is included in an EEPROM.

17. A data writing system comprising:

memory means for storing data having at least one bit per word to be stored therein;

data storage means for receiving data of $2^n$ words at a time of data writing in said memory means, where n is a positive integer;

writing means for writing said data stored in said data storage means into said memory means, after said data of $2^n$ words or smaller is received by said data storage means, said writing means writing said data received in said data storage means within a predetermined time into said memory means; and control means for outputting to an outside a signal indicating a data reception period for said data storage means.

* * * * *

UNITED STATES PATENT AND TRADEMARK OFFICE
CERTIFICATE OF CORRECTION

PATENT NO. : 4,891,791
DATED : January 2, 1990
INVENTOR(S) : IIJIMA, YASUO

It is certified that error appears in the above-identified patent and that said Letters Patent is hereby corrected as shown below:

FIRST PAGE, (TITLE PAGE):

Reads: "[75] Inventor: Yasno Iijima, Yokohama, Japan"

Should read: --[75] Inventor: Yasuo Iijima, Yokohama, Japan--

Signed and Sealed this

Sixteenth Day of October, 1990

Attest:

HARRY F. MANBECK, JR.

Attesting Officer

Commissioner of Patents and Trademarks